US011496116B2

(12) United States Patent
Takata

(10) Patent No.: US 11,496,116 B2
(45) Date of Patent: Nov. 8, 2022

(54) ACOUSTIC WAVE FILTER DEVICE, MULTIPLEXER AND COMPOSITE FILTER DEVICE

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/672,563

(22) Filed: Nov. 4, 2019

(65) Prior Publication Data

US 2020/0067489 A1 Feb. 27, 2020

Related U.S. Application Data

(63) Continuation of application No. PCT/JP2018/021208, filed on Jun. 1, 2018.

(30) Foreign Application Priority Data

Jun. 6, 2017 (JP) .............................. JP2017-111804

(51) Int. Cl.
*H03H 9/64* (2006.01)
*H03H 9/54* (2006.01)
(Continued)

(52) U.S. Cl.
CPC ...... *H03H 9/6496* (2013.01); *H03H 9/02559* (2013.01); *H03H 9/02992* (2013.01);
(Continued)

(58) Field of Classification Search
CPC ...... H03H 9/64; H03H 9/6496; H03H 9/6483; H03H 9/725; H03H 9/14502; H03H 9/14517
(Continued)

(56) References Cited

U.S. PATENT DOCUMENTS 6,914,498 B2 * 7/2005 Kadota .............. H03H 9/02559
310/313 A
7,345,400 B2 * 3/2008 Nakao ................ H03H 9/02559
310/313 A
(Continued)

FOREIGN PATENT DOCUMENTS

JP 2009-027689 A 2/2009
JP 2012-186808 A 9/2012
(Continued)

OTHER PUBLICATIONS

Official Communication issued in International Patent Application No. PCT/JP2018/021208 dated Aug. 14, 2018.

*Primary Examiner* — Rakesh B Patel
(74) *Attorney, Agent, or Firm* — Keating & Bennett, LLP

(57) ABSTRACT

An acoustic wave filter device includes at least one series arm resonator and a parallel arm resonator. The series arm resonators and the parallel arm resonator are defined by acoustic wave resonators, an interdigital transducer electrode of the series arm resonators is an apodized interdigital transducer electrode subjected to apodization weighting, in the interdigital transducer electrode of the parallel arm resonator, an intersecting portion includes a central region and low acoustic velocity regions provided at both outer side portions of the central portion, an acoustic velocity of an acoustic wave in the low acoustic velocity region is lower than an acoustic velocity of an acoustic wave in the central region, and a high acoustic velocity region where an acoustic velocity of an acoustic wave is higher than that of the low acoustic velocity region is provided at an outer side portion of each of the low acoustic velocity regions.

17 Claims, 8 Drawing Sheets

(51) Int. Cl.
*H03H 9/02* (2006.01)
*H03H 9/145* (2006.01)
*H03H 9/25* (2006.01)
*H03H 9/72* (2006.01)

(52) U.S. Cl.
CPC ............ *H03H 9/1452* (2013.01); *H03H 9/25* (2013.01); *H03H 9/54* (2013.01); *H03H 9/542* (2013.01); *H03H 9/6483* (2013.01); *H03H 9/725* (2013.01)

(58) Field of Classification Search
USPC .................................................. 333/186, 193
See application file for complete search history.

(56) References Cited

U.S. PATENT DOCUMENTS

| | | | | |
|---|---|---|---|---|
| 7,939,989 | B2* | 5/2011 | Solal | H03H 9/1452 310/313 B |
| 8,294,331 | B2* | 10/2012 | Abbott | H03H 9/1457 310/313 B |
| 8,421,560 | B2* | 4/2013 | Yamamoto | H03H 9/1452 333/195 |
| 9,154,113 | B2* | 10/2015 | Takata | H03H 9/64 |
| 9,257,960 | B2* | 2/2016 | Ruile | H03H 9/1457 |
| 2008/0315973 | A1 | 12/2008 | Nakamura et al. | |
| 2010/0237963 | A1 | 9/2010 | Takamine | |
| 2011/0068655 | A1 | 3/2011 | Solal et al. | |
| 2013/0002372 | A1 | 1/2013 | Uesaka | |
| 2013/0088305 | A1 | 4/2013 | Takata | |
| 2016/0065176 | A1* | 3/2016 | Taniguchi | H03H 9/14541 333/195 |
| 2016/0072477 | A1* | 3/2016 | Inoue | H03H 9/725 333/133 |
| 2017/0005637 | A1* | 1/2017 | Nakamura | H03H 9/1085 |
| 2017/0077902 | A1* | 3/2017 | Daimon | H03H 9/1457 |
| 2017/0117873 | A1 | 4/2017 | Takata | |
| 2017/0294897 | A1 | 10/2017 | Kanazawa et al. | |
| 2018/0097508 | A1 | 4/2018 | Iwamoto et al. | |

FOREIGN PATENT DOCUMENTS

| | | |
|---|---|---|
| JP | 2017-085262 A | 5/2017 |
| KR | 10-2010-0089868 A | 8/2010 |
| WO | 2011/115014 A1 | 9/2011 |
| WO | 2011/161987 A1 | 12/2011 |
| WO | 2015/182521 A1 | 12/2015 |
| WO | 2016/111262 A1 | 7/2016 |
| WO | 2016/208446 A1 | 12/2016 |

* cited by examiner

ACOUSTIC WAVE FILTER DEVICE, MULTIPLEXER AND COMPOSITE FILTER DEVICE

CROSS REFERENCE TO RELATED APPLICATIONS

This application claims the benefit of priority to Japanese Patent Application No. 2017-111804 filed on Jun. 6, 2017 and is a Continuation Application of PCT Application No. PCT/JP2018/021208 filed on Jun. 1, 2018. The entire contents of each application are hereby incorporated herein by reference.

BACKGROUND OF THE INVENTION

1. Field of the Invention

The present invention relates to an acoustic wave filter device including at least one series arm resonator and a parallel arm resonator, and a multiplexer and a composite filter device including the acoustic wave filter device.

2. Description of the Related Art

An existing ladder filter using a piston mode in order to significantly reduce or prevent transverse mode ripples has been known. For example, in the ladder filter described in WO 2015/182521, a series arm resonator and a parallel arm resonator each have an interdigital transducer electrode using a piston mode. In this interdigital transducer electrode, an intersecting portion includes a central region and a low acoustic velocity region located on one side and another side of the central region within the intersecting portion. An acoustic velocity in the low acoustic velocity region is lower than an acoustic velocity in the central region. Further, a high acoustic velocity region is provided at an outer side portion of the low acoustic velocity region in an intersecting width direction. In the ladder filter described in WO 2015/182521, a Love wave is used in the acoustic wave resonator including the above-described interdigital transducer electrode.

In the ladder filter described in WO 2015/182521, it is possible to reduce a transverse mode ripple of the Love wave. However, in the acoustic wave resonator including the above-described interdigital transducer electrode, a transverse mode response of the Rayleigh wave also appears. When the transverse mode response of the Rayleigh wave is generated in the series arm resonator among the series arm resonator and the parallel arm resonator of the ladder filter, the ripple appears in the frequency band on a low frequency side of the pass band the ladder filter. Therefore, there has been a problem in that the filter characteristics are deteriorated.

SUMMARY OF THE INVENTION

Preferred embodiments of the present invention provide acoustic wave filter devices, multiplexers, and composite filter devices including the acoustic wave filter devices, in which deterioration in filter characteristics due to a transverse mode ripple hardly occurs.

An acoustic wave filter device according to a preferred embodiment of the present invention includes at least one series arm resonator provided in a series arm connecting an input end and an output end, and a parallel arm resonator provided in at least one parallel arm connecting the series arm and a ground potential, in which the series arm resonator and the parallel arm resonator are defined by acoustic wave resonators including a piezoelectric substrate and an interdigital transducer electrode provided on the piezoelectric substrate, the interdigital transducer electrode of the at least one series arm resonator is an apodized interdigital transducer electrode subjected to apodization weighting, and the interdigital transducer electrode of the parallel arm resonator includes an intersecting portion where a plurality of first electrode fingers and a plurality of second electrode fingers overlap each other in an acoustic wave propagation direction, the intersecting portion includes a central region and low acoustic velocity regions provided at both outer side portions of the central region in a direction orthogonal or substantially orthogonal to an acoustic wave propagation direction, an acoustic velocity of an acoustic wave in the low acoustic velocity region is lower than an acoustic velocity of an acoustic wave in the central region, and a high acoustic velocity region where an acoustic velocity of an acoustic wave is higher than the low acoustic velocity region is provided at an outer side portion of each of the low acoustic velocity regions in a direction orthogonal to an acoustic wave propagation direction.

In an acoustic wave filter device according to a preferred embodiment of the present invention, preferably, all of the series arm resonators include the apodized interdigital transducer electrode. In this case, a ripple caused by a transverse mode can be more significantly reduced or prevented.

In an acoustic wave filter device according to a preferred embodiment of the present invention, the series arm resonator including the apodized interdigital transducer electrode includes, first and second busbars, a plurality of first electrode fingers each including one end connected to an inner end edge of the first busbar, a plurality of second electrode fingers each including one end connected to an inner end edge of the second busbar, a plurality of first dummy electrode fingers each including one end connected to the second busbar, and a tip end facing a tip end of each of the plurality of first electrode fingers, and a plurality of second dummy electrode fingers each including one end connected to the first busbar, and a tip end facing a tip end of each of the plurality of second electrode fingers, and each of the inner end edges to which the first and second electrode fingers of the first and second busbars are respectively connected has a portion which is not parallel to an acoustic wave propagation direction.

In an acoustic wave filter device according to a preferred embodiment of the present invention, a Love wave is used. In this case, since at least one series arm resonator includes the apodized interdigital transducer electrode, the transverse mode ripple of the Rayleigh wave can be significantly reduced or prevented.

In an acoustic wave filter device according to a preferred embodiment of the present invention, the piezoelectric substrate includes $LiNbO_3$.

In an acoustic wave filter device according to a preferred embodiment of the present invention, a ladder filter is provided as the acoustic wave filter device according to a preferred embodiment of the present invention.

In an acoustic wave filter device according to the preferred embodiments of the present invention, a longitudinally coupled resonator acoustic wave filter arranged in the series arm may be further provided.

A multiplexer according to a preferred embodiment of the present invention is a multiplexer including the acoustic wave filter device configured in accordance with a preferred embodiment of the present invention and a second acoustic wave filter device including a band pass filter and including one end commonly connected to the acoustic wave filter device.

A composite filter device according to a preferred embodiment of the present invention includes the acoustic wave filter device configured in accordance with a preferred embodiment of the present invention and a plurality of filters each including one end commonly connected to the acoustic wave filter device.

According to acoustic wave filter devices of preferred embodiments of the present invention, since at least one series arm resonator includes an apodized interdigital transducer electrode, deterioration of filter characteristics due to a transverse mode ripple is unlikely to occur. Therefore, it is possible to provide acoustic wave filter devices having excellent filter characteristics, and multiplexers and composite filter devices including the acoustic wave filter devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be made clear hereinafter through descriptions of specific preferred embodiments of the present invention with reference to the drawings.

It should be noted that the preferred embodiments described herein are illustrative and that a partial substitution or combination of configurations may be possible between different preferred embodiments.

Figure 1:
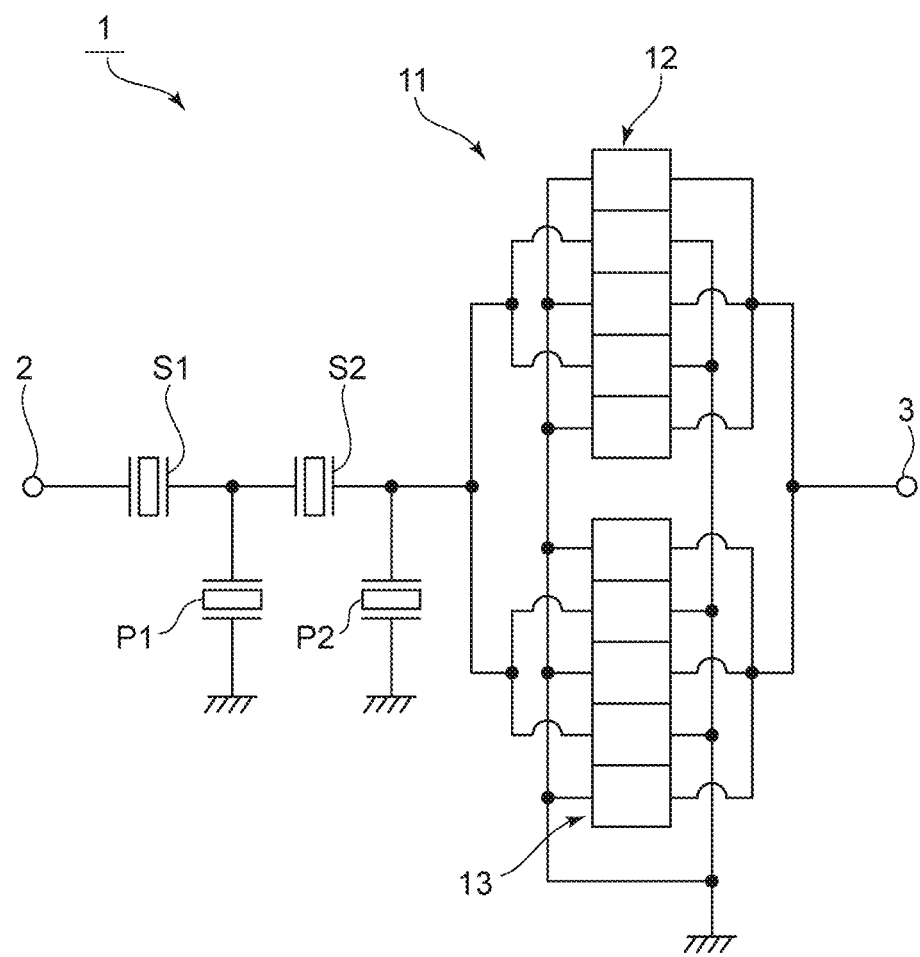
FIG. 1 is a circuit diagram of an acoustic wave filter device according to a first preferred embodiment of the present invention.

FIG. 1 is a circuit diagram of an acoustic wave filter device according to a first preferred embodiment of the present invention. An acoustic wave filter device 1 includes an input terminal 2 and an output terminal 3. In a series arm connecting the input terminal 2 and the output terminal 3, series arm resonators S1 and S2 are connected in series. A parallel arm resonator P1 is provided in a parallel arm connecting a connection point between the series arm resonators S1 and S2 and a ground potential. A longitudinally coupled resonator acoustic wave filter 11 is connected between the series arm resonator S2 and the output terminal 3. A parallel arm resonator P2 is provided in a parallel arm connecting a connection point between the series arm resonator S2 and the longitudinally coupled resonator acoustic wave filter 11 and a ground potential.

The longitudinally coupled resonator acoustic wave filter 11 includes first and second longitudinally coupled resonator acoustic wave filter units 12 and 13. The first longitudinally coupled resonator acoustic wave filter unit 12 and the second longitudinally coupled resonator acoustic wave filter unit 13 are connected in parallel. Each of the first and second longitudinally coupled resonator acoustic wave filter units 12 and 13 is preferably, for example, a five IDT longitudinally coupled resonator acoustic wave filter including five interdigital transducer electrodes.

Each of the series arm resonators S1 and S2 and the parallel arm resonators P1 and P2 is preferably defined by an acoustic wave resonator. In the acoustic wave filter device 1, a ladder filter including the series arm resonators S1 and S2 and the parallel arm resonators P1 and P2, and the longitudinally coupled resonator acoustic wave filter 11 are connected. Accordingly, a reception filter of Band 8 is provided. The Band 8 has a reception band from about 925 MHz to about 960 MHz.

The acoustic wave filter device 1 includes the series arm resonators S1 and S2 including apodized interdigital transducer electrodes as described later, and the parallel arm resonators P1 and P2, and the longitudinally coupled resonator acoustic wave filter 11 being the other resonators including interdigital transducer electrodes using a piston mode, and the interdigital transducer electrode are not subjected to apodization. Therefore, as will be described later, it is possible to significantly reduce or prevent the transverse mode ripple.

In the acoustic wave filter device 1, a Love wave, for example, is used as an acoustic wave. The series arm resonators S1 and S2 and the parallel arm resonators P1 and P2 and the longitudinally coupled resonator acoustic wave filter 11 preferably include, for example, a Y-cut LiNbO$_3$ substrate as a piezoelectric substrate. Further, a SiO$_2$ film is laminated on the piezoelectric substrate. On the SiO$_2$ film, an interdigital transducer electrode preferably including, for example, a laminated metal film including a NiCr film/Pt film/Ti film/AlCu film in this order from the bottom is provided. Additionally, a SiO$_2$ film and a SiN film are stacked in this order as a protective film that covers the interdigital transducer electrode.

Note that the cut-angle of the LiNbO$_3$ substrate is preferably in a range of equal to or more than about −4° and equal to or less than about +4°, and more preferably approximately 0°, for example. In this case, an electromechanical coupling coefficient of the Rayleigh wave which is an unnecessary wave can be made sufficiently small, and an electromechanical coupling coefficient of the Love wave can be made large.

Figure 2:
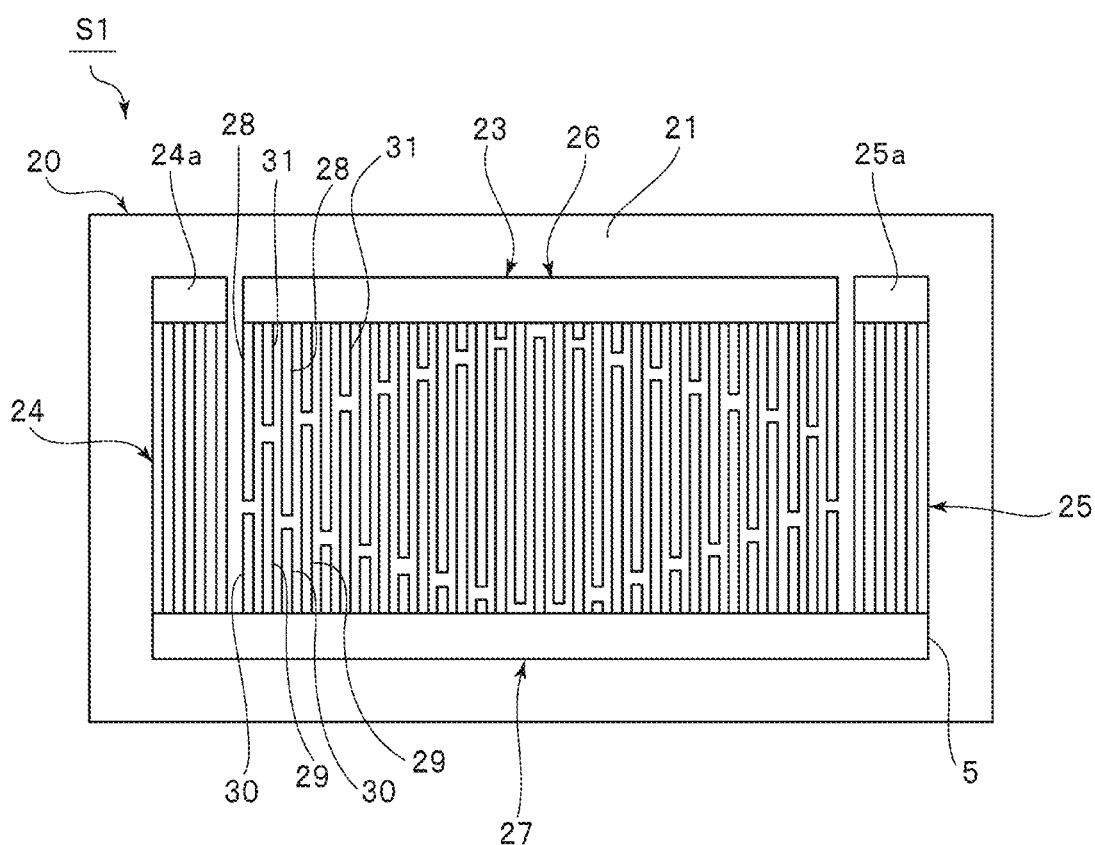
FIG. 2 is a plan view of an acoustic wave resonator as a series arm resonator S1.

FIG. 2 is a plan view of an acoustic wave resonator as the series arm resonator S1. In FIG. 2, a state in which the $SiO_2$ film and the SiN film defining and functioning as the above-described protective film are removed is shown.

The series arm resonator S1 includes a piezoelectric substrate 20. As described above, the piezoelectric substrate 20 includes the Y-cut $LiNbO_3$ substrate. However, in the preferred embodiments of the present invention, the piezoelectric substrate may include another piezoelectric single crystal, for example, $LiTaO_3$. Further, the piezoelectric substrate may have a structure in which a piezoelectric film is laminated on a support substrate.

A $SiO_2$ film 21 is laminated on the piezoelectric substrate 20. An interdigital transducer electrode 23 and reflectors 24 and 25 are provided on the $SiO_2$ film 21. Accordingly, one port surface acoustic wave resonator is provided.

The interdigital transducer electrode 23 is an apodized interdigital transducer electrode. The interdigital transducer electrode 23 includes first and second busbars 26 and 27. One end of a plurality of first electrode fingers 28 is connected to the first busbar 26. One end of a plurality of second electrode fingers 29 is connected to the second busbar 27. A first dummy electrode finger 30 is spaced away from a tip of the first electrode finger 28 with a gap therebetween. One end of the first dummy electrode finger 30 is connected to the second busbar 27. A second dummy electrode finger 31 is spaced away from a tip end of the second electrode finger 29 with a gap therebetween. One end of the second dummy electrode finger 31 is connected to the first busbar 26.

The plurality of first electrode fingers 28 and the plurality of second electrode fingers 29 are interdigitated with each other. A direction orthogonal or substantially orthogonal to a direction in which the first and second electrode fingers 28 and 29 extend corresponds to the acoustic wave propagation direction. The interdigital transducer electrode 23 is subjected to apodization weighting to provide an apodized interdigital transducer electrode. More specifically, when viewed in the acoustic wave propagation direction, a portion where the first electrode finger 28 and the second electrode finger 29 overlap each other is an intersecting portion. A dimension of the intersecting portion in the direction in which the first and second electrode fingers 28 and 29 extend is an intersecting width. In the interdigital transducer electrode 23, the intersecting width varies along the acoustic wave propagation direction. Accordingly, the apodization weighting is provided.

Since the apodized interdigital transducer electrode 23 subjected to the apodization weighting is provided, the response of the transverse mode due to the Rayleigh wave can be reduced, as will be described later.

In the reflectors 24 and 25, both ends of a plurality of electrode fingers are short-circuited. On one end side, busbars 24a and 25a are each provided. A busbar on another side is common to the second busbar 27 of the interdigital transducer electrode 23.

Although the structure of the series arm resonator S1 has been described, the series arm resonator S2 also preferably has the same or similar structure as that of the series arm resonator S1.

Figure 3:
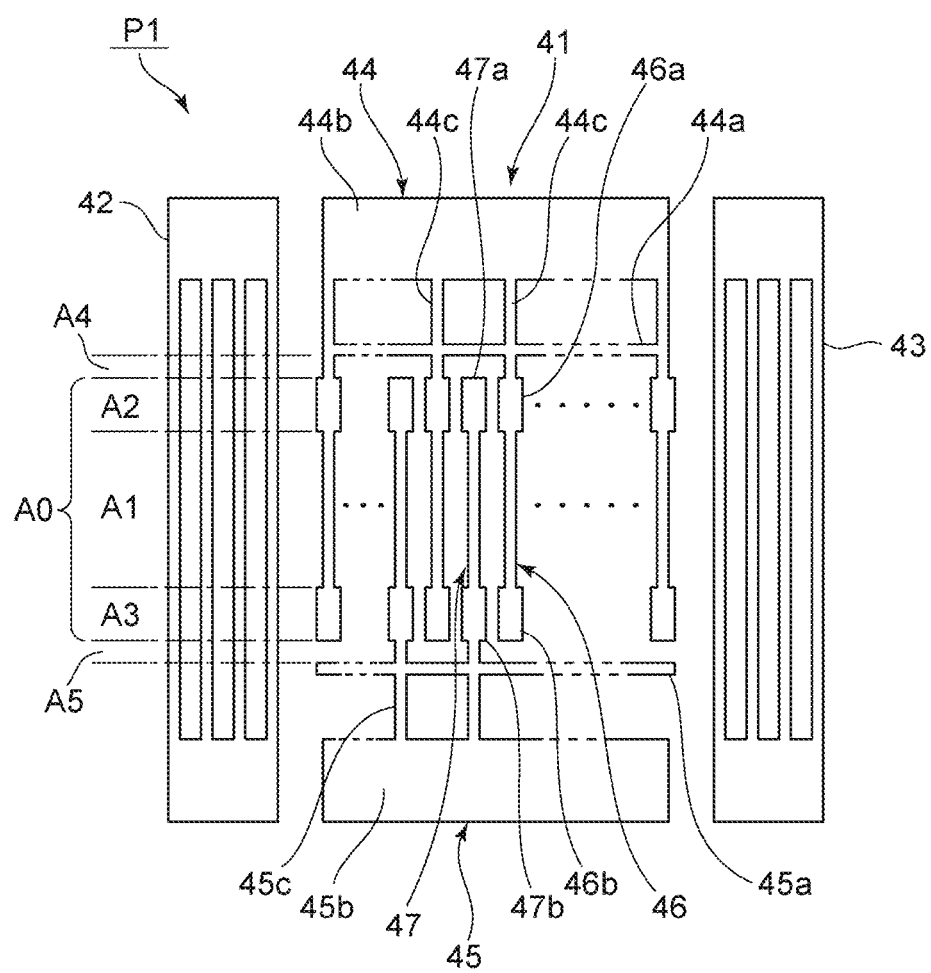
FIG. 3 is a plan view showing an electrode structure of a parallel arm resonator P1.

FIG. 3 is a plan view showing an electrode structure of the parallel arm resonator P1. In the parallel arm resonator P1, reflectors 42 and 43 are provided on both sides of an interdigital transducer electrode 41 in the acoustic wave propagation direction. Accordingly, the parallel arm resonator P1 is also one port surface acoustic wave resonator.

However, in the parallel arm resonator P1, the interdigital transducer electrode 41 is not subjected to the apodization weighting. That is, the interdigital transducer electrode 41 is not an apodized interdigital transducer electrode.

The interdigital transducer electrode 41 is provided in order to provide an acoustic wave resonator using a piston mode. The interdigital transducer electrode 41 includes first and second busbars 44 and 45. One end of a plurality of first electrode fingers 46 is connected to the first busbar 44. One end of a plurality of second electrode fingers 47 is connected to the second busbar 45. The first electrode finger 46 and the second electrode finger 47 are interdigitated with each other.

A portion where the first electrode finger 46 and the second electrode finger 47 overlap each other in the acoustic wave propagation direction is an intersecting portion A0. The intersecting portion A0 includes a central region A1 located at the center in a direction orthogonal or substantially orthogonal to the acoustic wave propagation direction, and first and second low acoustic velocity regions A2 and A3 provided at an outer side portion of the central region A1 in the direction orthogonal or substantially orthogonal to the acoustic wave propagation direction. In order to lower acoustic velocities of the acoustic waves in the first and second low acoustic velocity regions A2 and A3, thick width portions 46a and 46b are provided at the first electrode finger 46. Also at the second electrode finger 47, thick width portions 47a and 47b are provided.

At the outer side portion of the above-described intersecting portion A0 in a direction orthogonal or substantially orthogonal to the acoustic wave propagation direction, first and second high acoustic velocity regions A4 and A5 having the same or substantially the same acoustic velocity as the center region A1 are provided.

The first busbar 44 includes an inner busbar portion 44a and an outer busbar portion 44b. A connecting portion 44c connects the inner busbar portion 44a and the outer busbar portion 44b. The connecting portions 44c and 44c are defined by a cavity. A width of the connecting portion 44c is equal or substantially equal to a width in the central region A1 of the first electrode finger 46 and the second electrode finger 47.

Also in the second busbar 45, an inner busbar portion 45a, an outer busbar portion 45b, and a connecting portion 45c are provided.

In a region where the inner busbar portions 44a and 45a are provided, the acoustic velocity of the acoustic wave is lower than that of the first and second low acoustic velocity regions A2 and A3. In a region where the connecting portions 44c and 45c are provided, the acoustic velocity of the acoustic wave is equal or substantially equal to that of the central region A1. In addition, in a region where the outer busbar portions 44b and 45b are provided, the acoustic velocity of the acoustic wave is a low acoustic velocity, similar to the portions where the inner busbar portions 44a and 45a are provided.

As described above, the interdigital transducer electrode 41 is provided with the center region A1 and the first and second low acoustic velocity regions A2 and A3 having an acoustic velocity lower than that of the center region A1, and the first and second high acoustic velocity regions A4 and A5 are provided at an outer side portion of the first and second low acoustic velocity regions A2 and A3. Therefore, in the acoustic wave resonator using the Love wave, it is possible to significantly reduce or prevent the transverse mode ripple caused by the Love wave.

The parallel arm resonator P2 includes the same or similar configuration as the parallel arm resonator P1.

Next, with reference to FIG. 4 and FIG. 5, an electrode structure of the first longitudinally coupled resonator acoustic wave filter unit 12 in the longitudinally coupled resonator acoustic wave filter 11 will be described.

Figure 4:
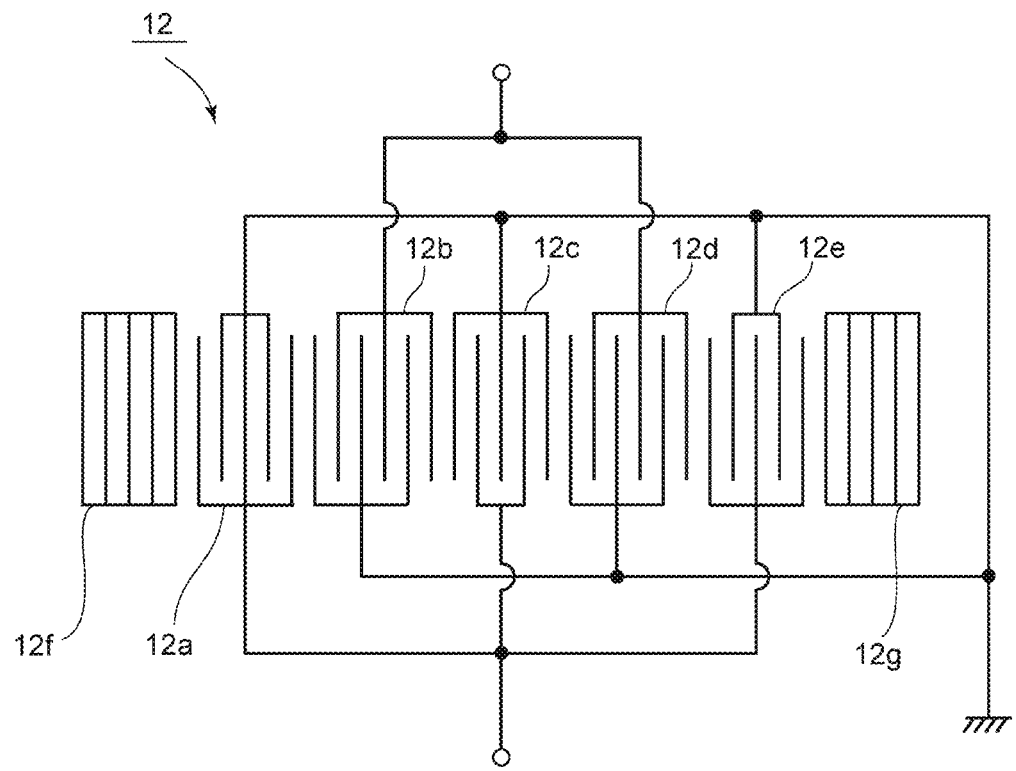
FIG. 4 is a plan view showing an electrode structure of a longitudinally coupled resonator acoustic wave filter used in the acoustic wave filter device according to the first preferred embodiment of the present invention.

As shown in FIG. 4, the first longitudinally coupled resonator acoustic wave filter unit 12 includes first to fifth interdigital transducer electrodes 12a to 12e. Reflectors 12f and 12g are provided on both sides in the acoustic wave propagation direction in a region where the first to fifth interdigital transducer electrodes 12a to 12e are provided.

Note that the number of interdigital transducer electrodes in the longitudinally coupled resonator acoustic wave filter according to the preferred embodiments of the present invention is not limited to five. A longitudinally coupled resonator acoustic wave filter, for example, a three IDT-type or a seven IDT-type may also be used.

Similarly to the parallel arm resonator P1, also in the first longitudinally coupled resonator acoustic wave filter unit 12, in order to use the piston mode, the central region, the first and second low acoustic velocity regions, and the first and second high acoustic velocity regions provided at outer side portions of the first and second low acoustic velocity regions are provided. This will be described with reference to FIG. 5.

Figure 5:
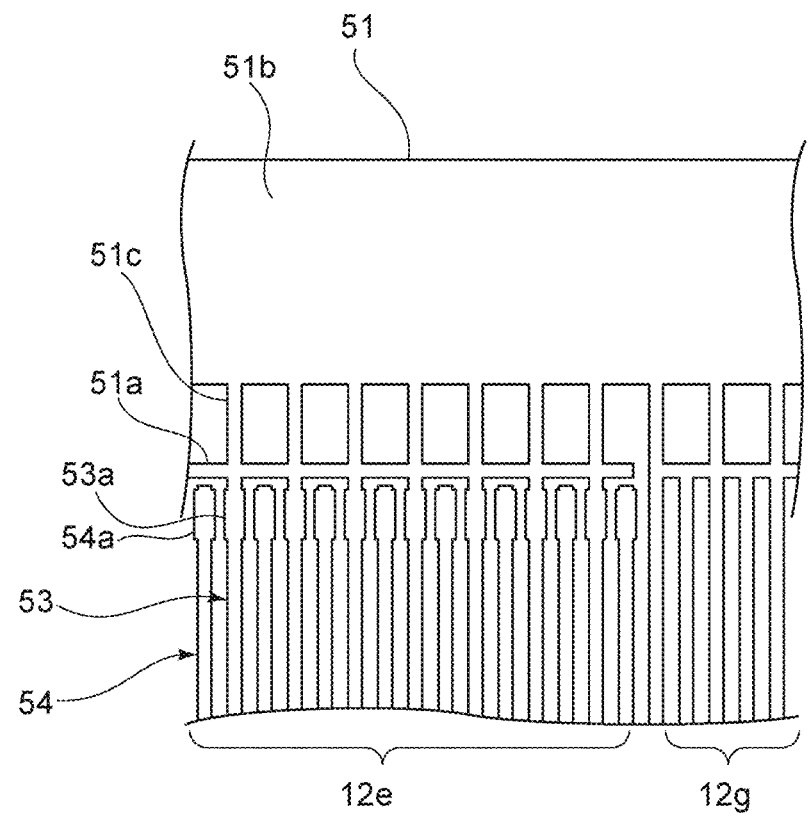
FIG. 5 is a partially cutaway plan view showing a portion of the electrode structure of the longitudinally coupled resonator acoustic wave filter shown in FIG. 4.

FIG. 5 is a partially cutaway plan view showing by enlarging a portion of a portion where the interdigital transducer electrode 12e and the reflector 12g are adjacent to or in a vicinity of each other in FIG. 4.

One end of a plurality of first electrode fingers 53 is connected to the first busbar 51. Similarly to the interdigital transducer electrode 41 shown in FIG. 3, the first busbar 51 includes an inner busbar portion 51a, an outer busbar portion 51b, and a connecting portion 51c. One end of a plurality of first electrode fingers 53 is connected to the inner busbar portion 51a. A plurality of first electrode fingers 53 and a plurality of second electrode fingers 54 are interdigitated with each other. The first electrode finger 53 and the second electrode finger 54 include thick width portions 53a and 54a. That is, since the thick width portions 53a and 54a are provided, a low acoustic velocity region is provided at the outer side portion of the central region in a direction orthogonal or substantially orthogonal to the acoustic wave propagation direction. Also on the second busbar side not shown in FIG. 5, a thick width portion is provided at the outer side portion of the central region to provide a low acoustic velocity region. That is, in the interdigital transducer electrode 12e, similarly to the interdigital transducer electrode 41 shown in FIG. 3, the first and second low acoustic velocity regions are provided on both sides of the central region. The first and second high acoustic velocity regions are respectively provided at outer side portions of the first and second low acoustic velocity regions. The other interdigital transducer electrodes 12a to 12d have the same or similar structure. Also, the second longitudinally coupled resonator acoustic wave filter unit 13 shown in FIG. 1 has an electrode structure similar to that of the first longitudinally coupled resonator acoustic wave filter unit 12. Therefore, since the longitudinally coupled resonator acoustic wave filter 11 also utilizes the piston mode, it is possible to significantly reduce or prevent the transverse mode ripple of the Love wave by a difference between the sound velocities.

In the acoustic wave filter device using the Love wave, the response of the Rayleigh wave which becomes the unnecessary wave may occur within the pass band. In this case, by setting the cut-angle of the piezoelectric substrate to be approximately 0', at least the response of the Rayleigh wave can be significantly reduced or prevented. However, depending on film thickness conditions of the interdigital transducer electrode, even if the cut-angle of the Y cut is selected, it was not possible to sufficiently reduce or prevent the response by the Rayleigh wave.

The conditions for the film thickness of the interdigital transducer electrode are determined in accordance with predetermined characteristics of the filter. In order to provide a sufficient reflection coefficient, the film thickness should be thick. Therefore, it is difficult to select the film thickness of the interdigital transducer electrode only from the viewpoint of significantly reducing or preventing the response of the Rayleigh wave. On the other hand, in recent years, along with the complexity of the modulation scheme of wireless communication, a good error vector magnitude (EVM) characteristic is preferred, but ripples appearing within the pass band deteriorate this EVM characteristic. Therefore, it is preferable to further significantly reduce or prevent the response caused by the above-described Rayleigh wave.

In the acoustic wave filter device 1, since the parallel arm resonators P1 and P2, and the longitudinally coupled resonator acoustic wave filter 11 include the interdigital transducer electrodes using the piston mode, the response in the transverse mode of the Love wave can be significantly reduced or prevented. In addition, since the series arm resonators S1 and S2 include the apodized interdigital transducer electrodes, the transverse mode due to the Rayleigh wave can be significantly reduced or prevented. This will be described based on a specific preferred embodiment.

As an example of the series arm resonator S1, an acoustic wave resonator of an Example 1 was fabricated by the following design parameters. For comparison, an acoustic wave resonator of the parallel arm resonator P1 including the interdigital transducer electrode using the piston mode was fabricated as an acoustic wave resonator of a Comparative Example 1.

In both of Example 1 and Comparative Example 1, the cut-angle of the $LiNbO_3$ substrate was set to about 0°. The lamination structure of the interdigital transducer electrode was as follows.

Thicknesses of the NiCr film/Pt film/Ti film/AlCu film were set to about 10 nm/70 nm/60 nm/200 nm in this order. The thickness of the $SiO_2$ film located below the interdigital transducer electrode was set to about 20 nm.

The thicknesses of the $SiO_2$ film and the SiN film as the protective film were set to about 1500 nm and about 20 nm, respectively.

In the acoustic wave resonator of Example 1, as shown in FIG. 2, apodization weighting was provided. On the other hand, in the acoustic wave resonator of Comparative Example 1, as shown in FIG. 3, the interdigital transducer electrode 41 was provided so that the first and second low acoustic velocity regions A2 and A3, and the first and second high acoustic velocity regions A4 and A5 were located at the outer side portion of the central region A1.

Figure 7:
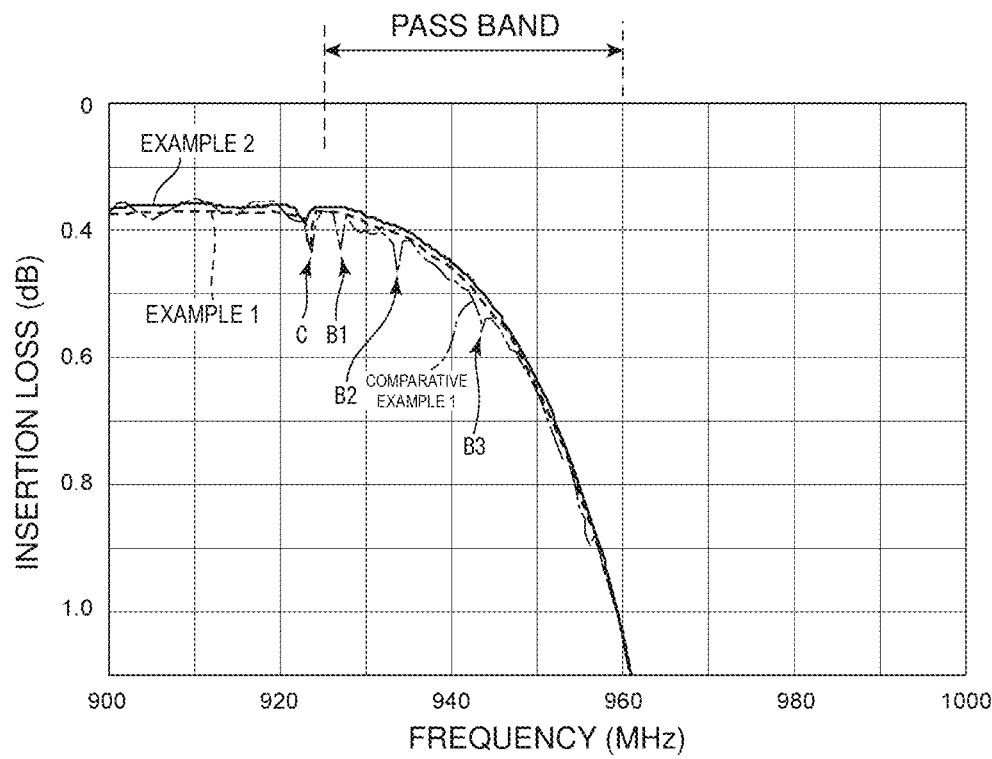
FIG. 7 is a diagram showing bandpass characteristics of acoustic wave resonators of an Example 1 and an Example 2, and an acoustic wave resonator of a Comparative Example 1.

The number of pairs of electrode fingers of each interdigital transducer electrode was set to 90. Further, the number of electrode fingers of each reflector was set to 10. Further, a wave length determined by an electrode finger pitch of the interdigital transducer electrode was set to be about 3.81 µm for the series arm resonator S1, about 3.83 µm for the series arm resonator S2, about 3.98 µm for the parallel arm resonator P1, and about 4.00 µm for the parallel arm resonator P2. FIG. 7 shows bandpass characteristics of the acoustic wave resonators of Example 1 and Comparative Example 1 described above.

A broken line in FIG. 7 indicates a result in Example 1, and an alternate long and short dash line indicates a result in Comparative Example 1. As shown in FIG. 7, in Comparative Example 1, ripples indicated by the arrows B1 to B3 appear in the pass band of the reception filter of the Band 8, particularly on the low frequency side of the pass band. In contrast, in the acoustic wave resonator of Example 1, the ripples indicated by the arrows B1 to B3 do not appear. The ripples indicated by the arrows B1 to B3 appearing in this frequency band is caused by the response in the transverse mode of the Rayleigh wave.

Therefore, it is understood that the ripple caused by the transverse mode of the Rayleigh wave can be significantly reduced or prevented by using the acoustic wave resonator of Example 1 having the apodized interdigital transducer electrode.

An acoustic wave filter device of an Example 3 as the above-described acoustic wave filter device 1 and an acoustic wave filter device of a Comparative Example 2 were fabricated as described below.

Acoustic wave filter device of Example 3: The acoustic wave resonator of Example 1 was used as the series arm resonators S1 and S2, and the acoustic wave resonator of Comparative Example 1 was used as the parallel arm resonators P1 and P2. The design parameters of the longitudinally coupled resonator acoustic wave filter 11 using the piston mode were set as follows.

Design parameters of the longitudinally coupled resonator acoustic wave filter 11 were set as follows: 22 pairs of the interdigital transducer electrode 12a, about 4.04 µm in wave length, 11.5 pairs of the interdigital transducer electrode 12b, about 4.02 µm in wave length, 8.5 pairs of the interdigital transducer electrode 12c, about 3.87 µm in wave length, 11.5 pairs of the interdigital transducer electrode 12d, about 3.97 µm in wave length, 14 pairs of the interdigital transducer electrode 12e, about 3.98 µm in wave length, and 27 electrode fingers in the reflectors 12f and 12g.

The acoustic wave filter device of Comparative Example 2 was similar to the acoustic wave filter device of Example 3 except that the series arm resonators S1 and S2 were the acoustic wave resonators using the piston mode similarly to the parallel arm resonators P1 and P2.

Figure 8:
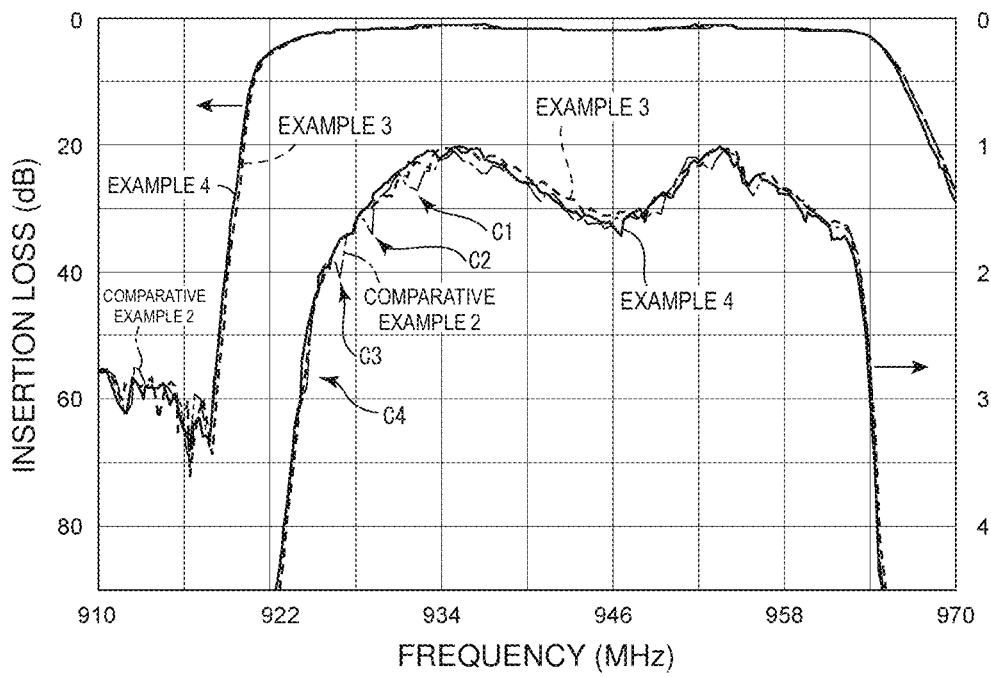
FIG. 8 is a diagram showing filter characteristics of an acoustic wave filter device of an Example 3, an acoustic wave filter device of an Example 4, and an acoustic wave filter device of a Comparative Example 2.

Broken lines in FIG. 8 indicate the filter characteristics of the acoustic wave filter device of Example 3, and alternate long and short dash lines indicate the filter characteristics of the acoustic wave filter device of Comparative Example 2.

As is apparent from FIG. 8, in the acoustic wave filter device of Comparative Example 2, ripples indicated by arrows C1 to C3 appear on the low frequency side in the pass band. In contrast, in the acoustic wave filter device of Example 3, it is possible to significantly reduce or prevent these ripples.

Figure 6:
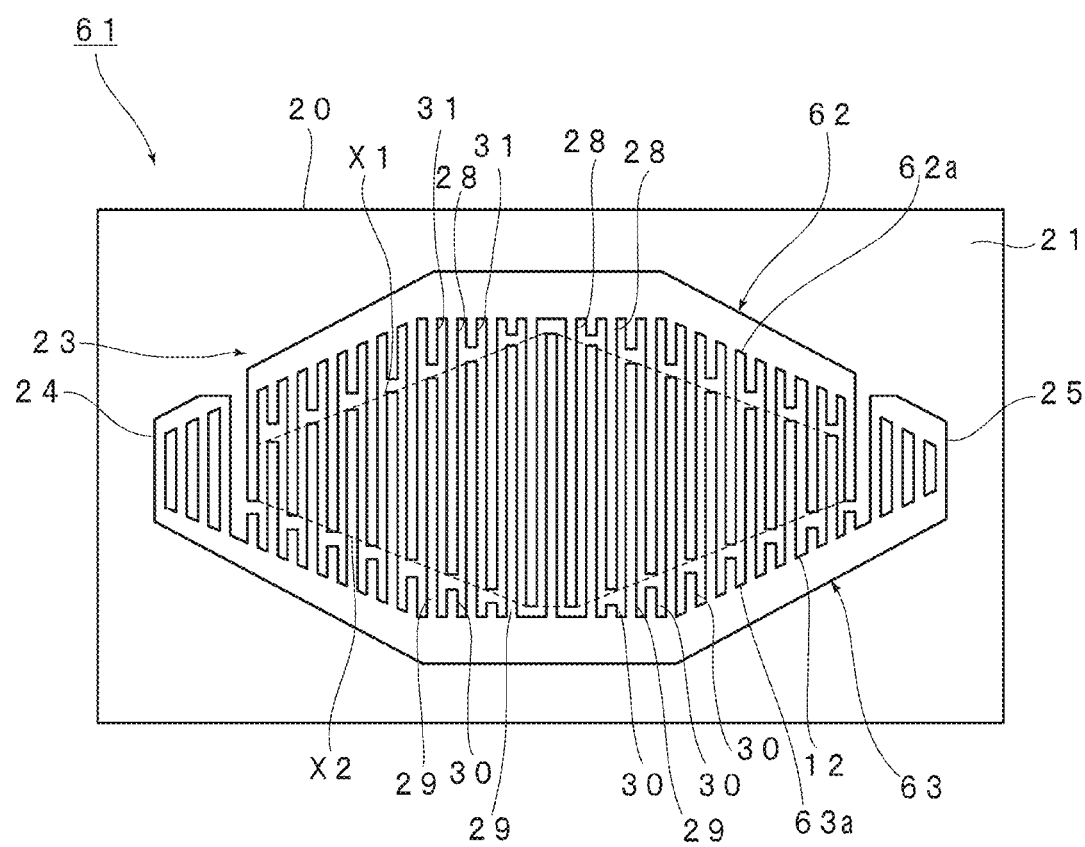
FIG. 6 is a plan view of an acoustic wave resonator used in the acoustic wave filter device of a second preferred embodiment of the present invention.

FIG. 6 is a plan view of an acoustic wave resonator including an apodized interdigital transducer electrode used in the acoustic wave filter device according to a second preferred embodiment of the present invention.

Similar to the series arm resonator S1 shown in FIG. 2, an acoustic wave resonator 61 includes an apodized interdigital transducer electrode. The different point is that inner end edges 62a and 63a of first and second busbars 62 and 63 include a portion which intersects the acoustic wave propagation direction in an oblique direction, that is, a portion which is not parallel or substantially parallel to the acoustic wave propagation direction, in the acoustic wave resonator 61.

Also in the reflectors 24 and 25, the inner end edge of the busbar is not parallel or substantially parallel to the acoustic wave propagation direction, similarly to the first and second busbars 62 and 63.

The other structure is the same as or similar to that of the series arm resonator S1. Therefore, the same reference numerals are denoted for the same components and elements, and a description thereof will be omitted.

In the acoustic wave resonator including the apodized interdigital transducer electrode used in the present preferred embodiment of the present invention as in the acoustic wave resonator 61, the inner end edges 62a and 63a of the first and second busbars 62 and 63 may not be parallel or substantially parallel to the acoustic wave propagation direction. When they are not parallel or substantially parallel, the regions occupied by the first and second dummy electrode fingers 30 and 31 in the acoustic wave propagation direction are reduced. Therefore, it is possible to significantly reduce or prevent even ripples caused by a longitudinal mode of the Rayleigh wave. This will be described based on a specific preferred embodiment.

As an example of the above-described acoustic wave resonator 61 of the second preferred embodiment, an acoustic wave resonator of Example 2 described below was fabricated.

The acoustic wave resonator 61 of Example 2 was similar to the acoustic wave resonator of Example 1 except that the inner end edges 62a and 63a of the first and second busbars 62 and 63 included portions parallel or substantially parallel to envelope lines X1 and X2, i.e., portions non-parallel or substantially non-parallel to the acoustic wave propagation direction, as shown in FIG. 6.

The bandpass characteristics of the acoustic wave resonator of Example 2 is shown by a solid line in FIG. 7. As shown in FIG. 7, in the acoustic wave resonators of Example 1 and Comparative Example 1, ripples appear in the vicinity of 924 MHz, as indicated by the arrow C. This is a ripple due to the longitudinal mode of the Rayleigh wave. In contrast, in the acoustic wave resonator of Example 2, there is no ripple due to the longitudinal mode of the Rayleigh wave. Since the ripple due to the longitudinal mode of the Rayleigh wave is located at an outer side portion of the pass band as shown in FIG. 7, but it is close to the pass band, which thus adversely affects the filter characteristics. Therefore, it is preferable that the ripple indicated by the arrow C is also significantly reduced or prevented.

In the second preferred embodiment, since the series arm resonators S1 and S2 are provided by using the above-described acoustic wave resonator 61, it is possible to significantly reduce or prevent the influence of ripples caused by the longitudinal mode of the Rayleigh wave. This will be described with reference to FIG. 8.

An acoustic wave filter device of an Example 4 was obtained as described below. The series arm resonators S1 and S2 were provided by using the acoustic wave resonator 61 of Example 2. The other configurations were the same as or similar to those of the acoustic wave filter device of Example 3. FIG. 8 shows the filter characteristics of the acoustic wave filter device of Example 4 by solid lines. As is apparent from FIG. 8, in a portion indicated by an arrow C4, the adverse effect due to the response in the longitudinal mode of the Rayleigh wave appears in Comparative Example 2 and Example 3, but in Example 4, the adverse influence due to the response in the longitudinal mode of the Rayleigh wave does not appear. Therefore, according to the acoustic wave filter device of Example 4, it is possible to further improve the filter characteristics.

As described above, in the acoustic wave filter devices of the first and second preferred embodiments, both of the series arm resonators S1 and S2 include the apodized interdigital transducer electrodes. In the preferred embodiments of the present invention, all of the series arm resonators do not necessarily have the apodized interdigital transducer electrodes. That is, it is sufficient that at least one series arm resonator includes the apodized interdigital transducer electrode. Accordingly, ripples due to the Rayleigh wave in the transverse mode can be significantly reduced or prevented, and deterioration of the filter characteristics can be significantly reduced or prevented. However, it is preferable that all of the series arm resonators include the apodized interdigital transducer electrode, for example. Therefore, the response of the Rayleigh wave in the transverse mode can be further significantly reduced or prevented.

Figure 9:
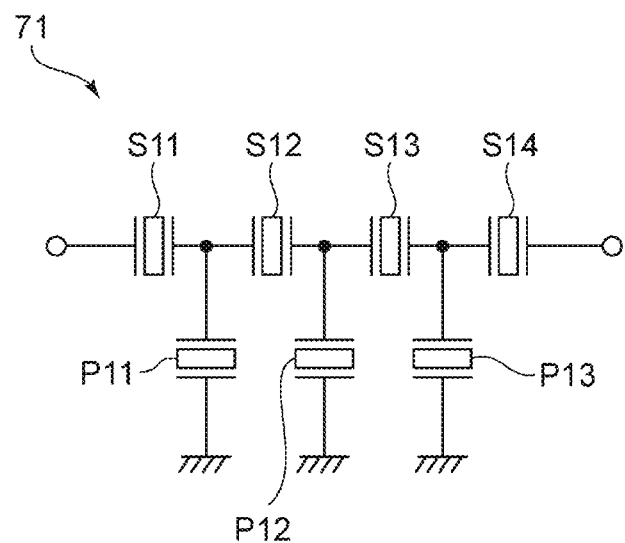
FIG. 9 is a circuit diagram showing an example of a ladder filter to which a preferred embodiment of the present invention is applied.

FIG. 9 is a circuit diagram showing an example of a ladder filter to which a preferred embodiment of the present invention is applied. An acoustic wave filter device 71 shown in FIG. 9 includes series arm resonators S11 to S14 and parallel arm resonators P11 to P13. That is, the acoustic wave filter device is a ladder filter. The acoustic wave filter device of a preferred embodiment of the present invention may be a ladder filter that does not include a longitudinally coupled resonator acoustic wave filter. Further, the number of stages of the ladder filter is not particularly limited.

In the acoustic wave filter device 71, at least one series arm resonator of the series arm resonators S11 to S14 may include an apodized interdigital transducer electrode. Further, the remaining series arm resonators may include an interdigital transducer electrode using a piston mode.

Figure 10:
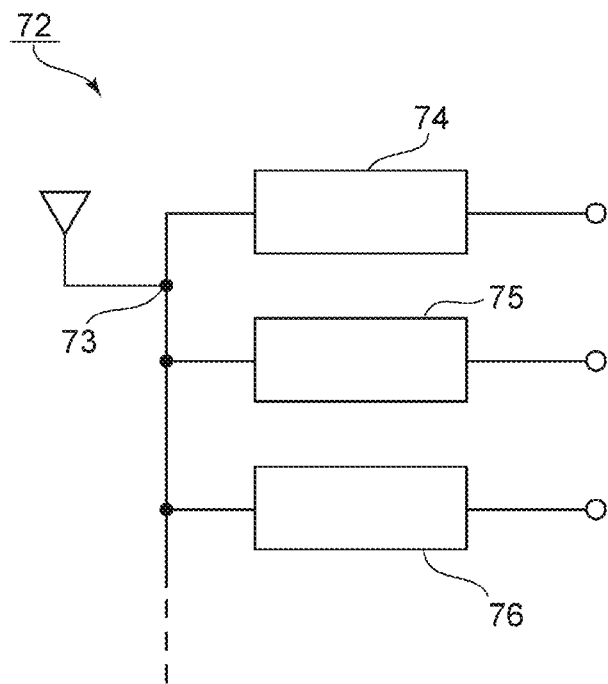
FIG. 10 is a circuit diagram of a composite filter device.

Further, the acoustic wave filter device according to the preferred embodiments of the present invention may be used in a composite filter device 72 shown in FIG. 10. In the composite filter device 72, one end of a plurality of filters 74 to 76 is commonly connected to a common terminal 73 connected to an antenna. An acoustic wave filter device according to a preferred embodiment of the present invention may be used for at least one of the filters 74 to 76.

Figure 11:
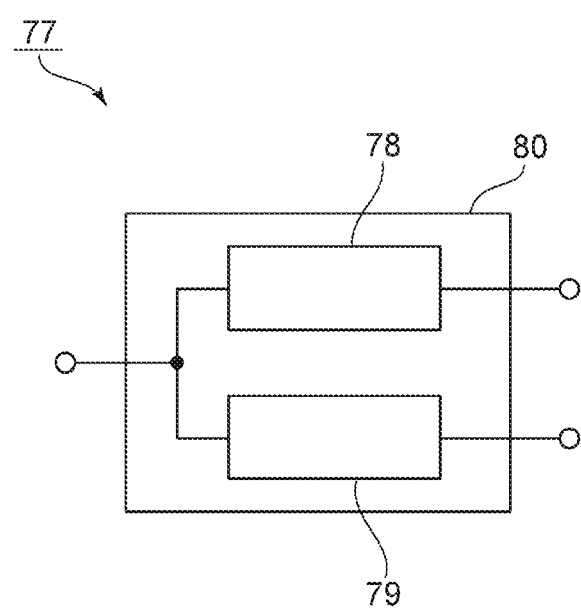
FIG. 11 is a circuit diagram showing a duplexer as an example of a multiplexer.

In a duplexer 77 shown in FIG. 11, an acoustic wave filter device according to a preferred embodiment of the present invention may be used. In the duplexer 77, first and second filter devices 78 and 79 which are a band pass filter are provided in one chip component 80. One ends of the respective first and second filter devices 78 and 79 are connected in a common connection. An acoustic wave filter device of a preferred embodiment of the present invention may be used in at least one of the first and second filter devices 78 and 79. However, it is preferable that the first and second filter devices 78 and 79 are first and second acoustic wave filter devices of preferred embodiments of the present invention, for example. Although the duplexer has been described as an example of a preferred embodiment of the present invention, the present invention may be applied to a multiplexer including three or more filter devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   at least one series arm resonator provided in a series arm connecting an input end and an output end;
   a parallel arm resonator provided in at least one parallel arm connecting the series arm and a ground potential; and
   a longitudinally coupled resonator acoustic wave filter provided in the series arm; wherein
   the at least one series arm resonator, the parallel arm resonator, and the longitudinally coupled resonator acoustic wave filter are defined by acoustic wave resonators including a piezoelectric substrate and an interdigital transducer electrode provided on the piezoelectric substrate;
   the interdigital transducer electrode of the at least one series arm resonator includes a first intersecting portion at which a plurality of first electrode fingers and a plurality of second electrode fingers overlap each other in an acoustic wave propagation direction;
   in the first intersecting portion, an intersecting width, which is a dimension of the first intersecting portion in a direction orthogonal or substantially orthogonal to the acoustic wave propagation direction, varies with respect to the acoustic wave propagation direction;
   at least one of the interdigital transducer electrodes of the parallel arm resonator and the longitudinally coupled resonator acoustic wave filter includes a second intersecting portion at which a plurality of third electrode fingers and a plurality of fourth electrode fingers overlap each other in an acoustic wave propagation direction;
   the second intersecting portion includes a central region and low acoustic velocity regions;
   the low acoustic velocity regions are provided at both outer side portions of the central region in the direction orthogonal or substantially orthogonal to the acoustic wave propagation direction;
   an acoustic velocity of an acoustic wave in the low acoustic velocity region is lower than an acoustic velocity of an acoustic wave in the central region;
   a high acoustic velocity region is provided at an outer side portion of each of the low acoustic velocity regions in the direction orthogonal or substantially orthogonal to the acoustic wave propagation direction; and
   an acoustic velocity of an acoustic wave in the high acoustic velocity region is higher than an acoustic wave in the low acoustic velocity region.

2. The acoustic wave filter device according to claim 1, wherein each of the at least one series arm resonator includes the first intersecting portion.

3. The acoustic wave filter device according to claim 1, wherein
   the at least one series arm resonator including the first intersecting portion includes:
   first and second busbars;
   the plurality of first electrode fingers each including one end connected to an inner end edge of the first busbar;
   the plurality of second electrode fingers each including one end connected to an inner end edge of the second busbar;
   a plurality of first dummy electrode fingers each including one end connected to the second busbar, and a tip end facing a tip end of each of the plurality of first electrode fingers; and
   a plurality of second dummy electrode fingers each including one end connected to the first busbar, and a tip end facing a tip end of each of the plurality of second electrode fingers; and
   each of the inner end edges to which the first and second electrode fingers of the first and second busbars are respectively connected includes a portion which is not parallel or substantially parallel to the acoustic wave propagation direction.

4. The acoustic wave filter device according to claim 1, wherein the interdigital transducer electrode of each of the parallel arm resonator and the longitudinally coupled resonator acoustic wave filter includes the second intersecting portion at which the plurality of third electrode fingers and the plurality of fourth electrode fingers overlap each other in the acoustic wave propagation direction.

5. The acoustic wave filter device according to claim 1, wherein the piezoelectric substrate includes $LiNbO_3$.

6. The acoustic wave filter device according to claim 1, wherein the acoustic wave filter device is a ladder filter.

7. The acoustic wave filter device according to claim 1, wherein a Love wave is used.

8. A multiplexer comprising:
the acoustic wave filter device according to claim 1; and
a second acoustic wave filter device including a band pass filter and including one end electrically connected to the acoustic wave filter device at a common connection.

9. The multiplexer according to claim 8, wherein the acoustic wave filter device and the second acoustic wave filter device are provided in one chip component.

10. The acoustic wave filter device according to claim 1, wherein the at least one series arm resonator includes two series arm resonators.

11. The acoustic wave filter device according to claim 1, further comprising:
a second parallel arm resonator; wherein
the at least one series arm resonator, the parallel arm resonator, and the second parallel arm resonator define a ladder filter.

12. The acoustic wave filter device according to claim 1, wherein the interdigital transducer electrode of the parallel arm resonator is not subjected to apodization weighting.

13. The acoustic wave filter device according to claim 1, wherein a cut-angle of the piezoelectric substrate is in a range of equal to or more than about −4° and equal to or less than about +4°.

14. The acoustic wave filter device according to claim 1, wherein
the at least one series arm resonator includes at least one reflector; and
the at least one series arm resonator is a one port surface acoustic wave resonator.

15. The acoustic wave filter device according to claim 14, wherein the interdigital transducer electrode of the at least one series arm resonator and the at least one reflector of the at least one series arm resonator are provided on a $SiO_2$ film that is laminated on the piezoelectric substrate.

16. The acoustic wave filter device according to claim 1, wherein reflectors are provided on both sides of the interdigital transducer electrode of the parallel arm resonator in the acoustic wave propagation direction.

17. A composite filter device comprising:
the acoustic wave filter device according to claim 1; and
a plurality of filters each including one end commonly electrically connected to the acoustic wave filter device.

* * * * *